US012666172B1

(12) United States Patent
Moreira

(10) Patent No.: US 12,666,172 B1
(45) Date of Patent: Jun. 23, 2026

(54) DUAL BAND IMAGE SWITCHING COMPENSATION SYSTEMS AND METHODS

(71) Applicant: Teledyne FLIR Commercial Systems, Inc., Goleta, CA (US)

(72) Inventor: Julie Moreira, Santa Barbara, CA (US)

(73) Assignee: Teledyne FLIR Commercial Systems, Inc., Goleta, CA (US)

( * ) Notice: Subject to any disclaimer, the term of this patent is extended or adjusted under 35 U.S.C. 154(b) by 57 days.

(21) Appl. No.: 18/752,679

(22) Filed: Jun. 24, 2024

Related U.S. Application Data

(60) Provisional application No. 63/510,594, filed on Jun. 27, 2023.

(51) Int. Cl.
| | |
|---|---|
| *H04N 25/67* | (2023.01) |
| *H04N 23/10* | (2023.01) |
| *H04N 23/20* | (2023.01) |
| *H10F 39/18* | (2025.01) |

(52) U.S. Cl.
CPC ............. *H04N 25/67* (2023.01); *H04N 23/10* (2023.01); *H04N 23/20* (2023.01); *H10F 39/184* (2025.01)

(58) Field of Classification Search
CPC ........ H04N 25/67; H04N 23/10; H04N 23/20; H10F 39/184; H10F 39/1843; H10F 39/1847
See application file for complete search history.

(56) References Cited

U.S. PATENT DOCUMENTS

| | | | | |
|---|---|---|---|---|
| 7,217,926 B1 * | 5/2007 | Choi | ..................... | H10F 39/024 |
| | | | | 257/E31.127 |
| 9,208,542 B2 | 12/2015 | Högasten et al. | | |
| 10,197,448 B2 | 2/2019 | Simolon et al. | | |
| 11,415,465 B2 | 8/2022 | Hagman et al. | | |
| 2009/0095909 A1 * | 4/2009 | Funaki | ...................... | G01J 5/22 |
| | | | | 250/338.4 |
| 2015/0129746 A1 * | 5/2015 | Wyles | .................... | H04N 25/78 |
| | | | | 250/208.1 |
| 2019/0208147 A1 * | 7/2019 | Larson | ................... | H04N 23/23 |
| 2020/0111980 A1 * | 4/2020 | Zhu | ...................... | H10K 30/211 |

* cited by examiner

*Primary Examiner* — Albert H Cutler
(74) *Attorney, Agent, or Firm* — Haynes and Boone, LLP

(57) ABSTRACT

Various techniques are provided to reduce fixed pattern noise (FPN) associated with the capturing of infrared images by infrared detectors operating in a dual band mode. In one example, a method includes operating a plurality of infrared detectors in a dual band mode to capture infrared images alternating between a first wavelength range and a second wavelength range. The operating comprises capturing a first infrared image corresponding to the first wavelength range, switching the infrared detectors to respond to the second wavelength range, and capturing a second infrared image corresponding to the second wavelength range. The method also includes calculating a correction term to compensate for dual band mode fixed pattern noise (FPN) in the second infrared image associated with the switching. The method also includes applying the correction term to the second infrared image to reduce the dual band mode FPN. Additional methods and systems are also provided.

20 Claims, 12 Drawing Sheets

COLUMN SELECT  140

COLUMN BIAS & S/H  152

(640,512)

ROW SELECT  160

APD ARRAY
(640 x 512)
(15µm Pixel)

110

BOND PADS  193

ROW SELECT  160

DAC (RIGHT)  180

COLUMN BIAS & S/H  122

COLUMN SELECT  120

BIAS/CONTROL

184/185/189

DAC (LEFT)  180

(1,1)

BOND PADS  193

BOND PADS  193

100

SB_SBNUC
710

DB_SBNUC
720

DB_DBNUC
730

DB_wOffOpt1
740

DB_wOffOpt2
750

SB_SBNUC

810

DB_SBNUC

820

DB_DBNUC

830

DB_wOffOpt1

840

DB_wOffOpt2

850

DUAL BAND IMAGE SWITCHING COMPENSATION SYSTEMS AND METHODS

CROSS REFERENCE TO RELATED APPLICATIONS

This application claims priority to and the benefit of U.S. Provisional Patent Application No. 63/510,594 filed Jun. 27, 2023 and entitled "DUAL BAND IMAGE SWITCHING COMPENSATION SYSTEMS AND METHODS," which is incorporated herein by reference in its entirety.

TECHNICAL FIELD

One or more embodiments of the invention relate generally to infrared imaging and more particularly, for example, to compensating for undesired noise associated with multi-band imaging.

BACKGROUND

In the field of infrared imaging, various non-uniformities may be present in captured images. For example, some non-uniformities may take the form of fixed pattern noise (FPN) due, for example, to non-linearity and/or imperfections in the composition or operation of infrared sensors and/or related circuitry. Such non-uniformities are often addressed by applying non-uniformity correction (NUC) terms to the resulting images to compensate for FPN associated with rows, columns, and/or pixels.

In some cases, multiband infrared imaging may be performed. For example, infrared detectors sensitive to different wavelength ranges (e.g., wavebands) may be used. As a result, different sets of NUC terms may be applied to images captured for the different wavelength ranges. However, the FPN exhibited in infrared images may vary depending on the manner in which detectors are operated. In particular, infrared images may exhibit different FPN depending on whether infrared images are captured in a single band mode with successive images captured for a single wavelength range, or in a dual band mode with alternating images captured for different wavelength ranges.

SUMMARY

Various techniques are provided for reducing FPN associated with the capturing of infrared images by infrared detectors operating in a dual band mode where infrared images of first and second wavelength ranges are captured in an alternating fashion. In some embodiments, the FPN associated with images captured in dual band alternating operation may be determined and characterized using image-to-image (e.g., frame-to-frame) signal differences.

In accordance with an embodiment of the disclosure, a method includes operating a plurality of infrared detectors in a dual band mode to capture infrared images alternating between a first wavelength range and a second wavelength range, wherein the operating comprises: capturing a first infrared image corresponding to the first wavelength range, switching the infrared detectors to respond to the second wavelength range, and capturing a second infrared image corresponding to the second wavelength range; calculating a correction term to compensate for dual band mode fixed pattern noise (FPN) in the second infrared image associated with the switching; and applying the correction term to the second infrared image to reduce the dual band mode FPN.

In accordance with another embodiment of the disclosure, a system includes a plurality of infrared detectors configured to: operate in a dual band mode to capture infrared images alternating between a first wavelength range and a second wavelength range, capture, in the dual band mode, a first infrared image corresponding to the first wavelength range, switch, in the dual band mode, to respond to the second wavelength range, and capture, in the dual band mode, a second infrared image corresponding to the second wavelength range; and a logic device configured to: calculate a correction term to compensate for dual band mode fixed pattern noise (FPN) in the second infrared image associated with the switch, and apply the correction term to the second infrared image to reduce the dual band mode FPN.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1A:
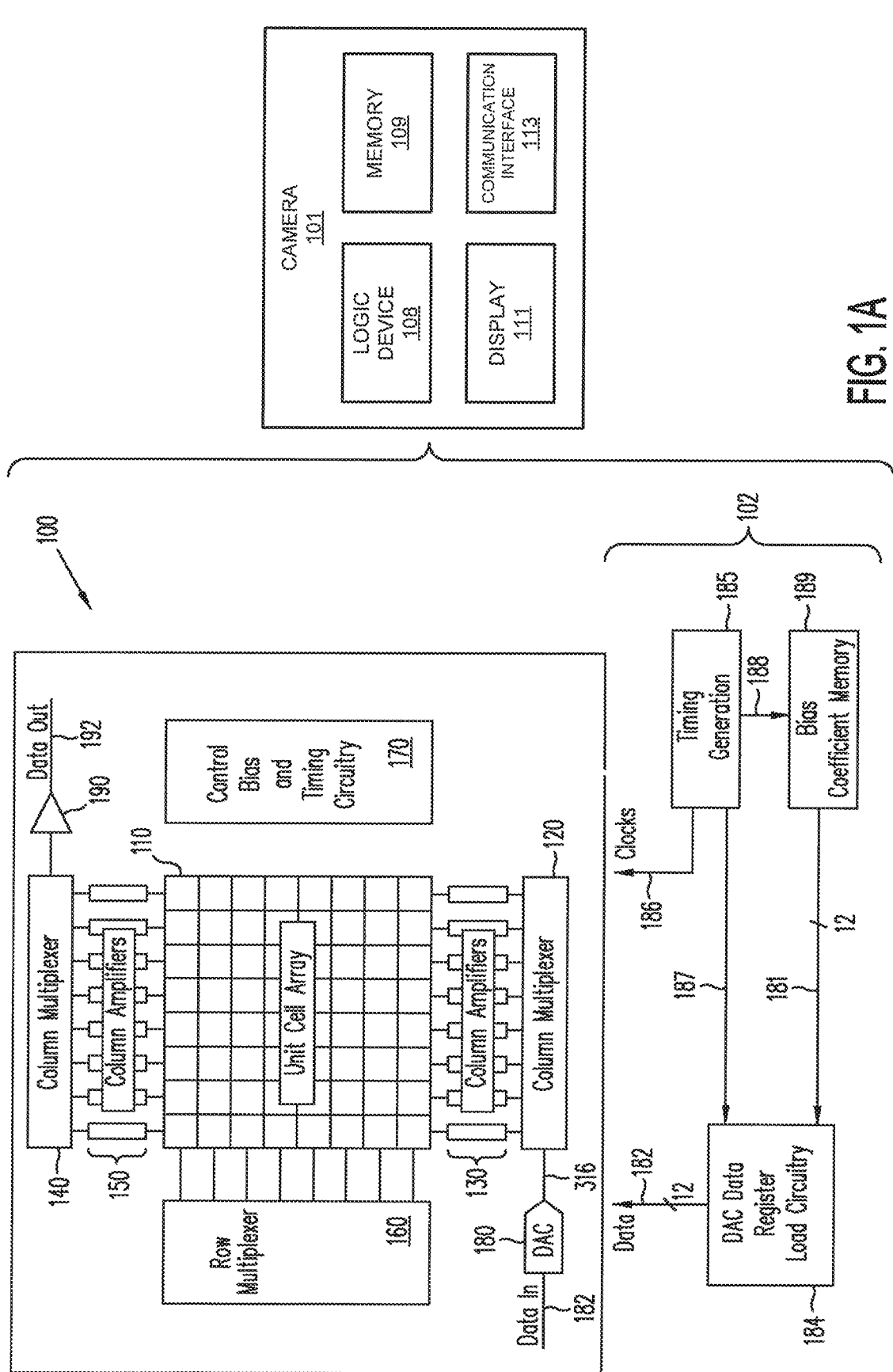
FIG. 1A illustrates a high level block diagram of a focal plane array and related circuitry in accordance with an embodiment of the disclosure.

As discussed, infrared images may exhibit different FPN depending on whether infrared images (e.g., also referred to as infrared image frames) are captured in a single band mode for a single wavelength range, or captured in a dual band mode with alternating images for different wavelength ranges. For example, infrared images captured in a single band mode using infrared detectors configured to capture infrared images corresponding to a first wavelength range may exhibit a first set of FPN, whereas infrared images captured in a single band mode using infrared detectors configured to capture infrared images corresponding to a second wavelength range may exhibit a second set of FPN.

However, infrared images captured in a dual band mode may exhibit FPN different from those captured in the single band mode. For example, if infrared images are captured by detectors configured to selectively capture infrared images corresponding to the first and the second wavelength ranges in an alternating dual band fashion (e.g., capturing an infrared image corresponding to the first wavelength range using detectors configured for the first wavelength range, then capturing an infrared image corresponding to the second wavelength range using detectors configured for the second wavelength range, and then repeating these operations), the alternating infrared images captured in the dual band mode may exhibit different FPN than the infrared images captured in the single band mode, even among images associated with the same wavelength ranges.

In some embodiments, this differing FPN may be caused by undesirable parasitic coupling between integration capacitors and sample-hold capacitors of unit cell circuits associated with the infrared detectors. As a result, applying single band NUC terms to alternating dual band images may not correct the different FPN present in dual band operation.

In some conventional approaches, this problem of different FPN associated with different modes of operation (e.g., sequential single band image capture versus alternating dual band image capture) may be addressed by calculating and applying different NUC terms for the different modes of operation. For example, in the case of infrared detectors configurable to capture infrared images corresponding to two different wavelength ranges, a total of four different sets of NUC terms may be provided (e.g., NUC terms for the first wavelength range in single band sequential operation, NUC terms for the second wavelength range in single band sequential operation, NUC terms for the first wavelength range in dual band alternating operation, and NUC terms for the second wavelength range in dual band alternating operation). However, these four sets of NUC terms effectively double the number of NUC terms that would otherwise be used for only single band operation. The additional NUC terms can require additional processing operations to determine and additional memory for storage that may be prohibitive in some implementations, particularly for low cost, low power, and/or mobile devices.

In accordance with various embodiments of the present disclosure, alternative approaches are provided that correct for the FPN associated with the capturing of infrared images in dual band alternating operation. In some embodiments, the FPN associated with images captured in dual band alternating operation may be characterized by various correlations as further discussed and additional correction terms based on those correlations using image-to-image (e.g., frame-to-frame) signal differences. NUC terms associated with single band sequential operation may be applied to dual band alternating operation, and then the additional correction terms based on the correlations may be applied to the infrared images. In various embodiments, the additional correction terms may be applied globally to all pixels of an infrared image and/or in a pixel-wise fashion with different adjustments to each pixel of the infrared image.

As a result, infrared images captured in an alternating dual band mode of detector operation may be corrected in a manner that improves upon what would be achievable by applying the single band NUC terms alone to dual band images, and without requiring the more extensive determination and storage of additional dual band NUC terms for both first and second wavelength ranges.

FIG. 1A illustrates a high level block diagram of a focal plane array (FPA) 100 and related circuitry 102 in accordance with an embodiment of the invention. FPA 100 includes a unit cell array 110, column multiplexers 120 and 140, column amplifiers 130 and 150, a row multiplexer 160, control bias and timing circuitry 170, a digital to analog converter (DAC) 180, and a data output buffer 190.

As shown in FIG. 1A, FPA 100 and circuitry 102 may be implemented as part of a camera, such as an infrared camera 101 and/or other appropriate imaging system. In this regard, it will be appreciated that, in addition to the various components of FPA 100 and circuitry 102, infrared camera 101 may also include one or more processors, memories, logic, displays, interfaces, lenses, and/or other components as may be appropriate in various implementations.

Unit cell array 110 includes a plurality of unit cells, each of which may include a detector and interface circuitry. The detector of each unit cell may be a photodetector (e.g., a photodiode, an avalanche photodiode, and/or other appropriate detector) that provides a detector signal (e.g., charge, current, voltage, or other signal forms) in response to light (e.g., infrared light or other light) received by the detector during an integration period. The interface circuitry may provide an output signal such as an output voltage or current (e.g., corresponding to a data value associated with the light received by the detector) in response to the detector signal provided by the detector. Column multiplexer 140, column amplifiers 150, row multiplexer 160, and data output buffer 190 may be used to provide the output signals from unit cell array 110 as a data output signal 192. In this regard, column multiplexer 140, column amplifiers 150, row multiplexer 160, and data output buffer 190 may collectively provide a read out integrated circuit (ROIC) of FPA 100.

In some embodiments, each unit cell may include one or more detectors responsive to different wavelength ranges. For example, in some embodiments, a photodiode may be implemented with a P-N junction that may be selectively operated in with a forward or reverse current corresponding to different detected wavelength ranges as discussed herein.

As shown in FIG. 1A, circuitry 102 may include a timing generation block 185 (e.g., which provides a plurality of clocks and/or other timing signals 186, 187, and 188 to FPA 100), DAC data register load circuitry 184, and a bias coefficient memory 189.

Bias coefficient memory 189 may store a plurality of bias coefficient values. For example, in one embodiment, one or more bias coefficient values may be stored for each unit cell of unit cell array 110. The bias coefficient values may be provided, in one embodiment, as a digital 12-bit data input signal 181 to DAC data register load circuitry 184 in response to timing signals 188. DAC data register load circuitry 184 may provide a data input signal 182 (e.g., corresponding to data input signal 181) in response to timing signals 187.

DAC 180 converts the digital bias coefficient values received in data input signal 182 into the bias voltages (e.g., analog signals 316) that may be provided to individual unit cells through the operation of column multiplexer 120, column amplifiers 130, and row multiplexer 160.

As shown, camera 101 may further include a logic device 108, a memory 109, and a communication interface 113. For example, logic device 108 may perform any of the various operations discussed herein and may use memory 109 to store various data including images, NUC terms, compensation adjustments, and/or other information as appropriate. Logic device 108 may include, for example, a microprocessor, a single-core processor, a multi-core processor, a microcontroller, a programmable logic device (e.g., a field programmable logic device (FPGA)), and/or other device configured to perform processing operations, a digital signal processing (DSP) device, one or more memories for storing executable instructions (e.g., software, firmware, or other instructions), and/or or any other appropriate combination of processing device and/or memory to execute instructions to perform any of the various operations described herein.

Memory 109 may include one or more memory devices (e.g., one or more memories) and/or machine readable mediums to store data and information. The one or more memory devices may include various types of memory including volatile and non-volatile memory devices, such as RAM (Random Access Memory), ROM (Read-Only Memory), EEPROM (Electrically-Erasable Read-Only Memory), flash memory, or other types of memory. In some embodiments, logic device 108 executes software stored in memory 109 to perform various methods, processes, and modes of operations in manner as described herein.

Display 111 may include a display device such as a liquid crystal display (LCD), an organic light-emitting diode (OLED) display, and/or other types of displays as appropriate to display images and/or information to a user of camera 101. Logic device 108 may be configured to display images and information on display 111. For example, logic device 168 may be configured to retrieve images and information from memory 109 and provide images and information to display 111 for presentation to the user of camera 101. Display 111 may include display electronics, which may be utilized by logic device 108 to display such images and information.

Logic device 108 may be configured to send and receive images and/or additional information to or from one or more external devices through communication interface 113 (e.g., through wired and/or wireless communications). In this regard, communication interface 113 may be implemented to provide wired communication over a cable and/or wireless communication over an antenna. For example, communication interface 113 may include one or more wired or wireless communication components, such as an Ethernet connection, a wireless local area network (WLAN) component based on the IEEE 802.11 standards, a wireless broadband component, mobile cellular component, a wireless satellite component, or various other types of wireless communication components including radio frequency (RF), microwave frequency (MWF), and/or infrared frequency (IRF) components configured for communication with a network. As such, communication interface 113 may include an antenna coupled thereto for wireless communication purposes. In other embodiments, the communication interface 113 may be configured to interface with a DSL (e.g., Digital Subscriber Line) modem, a PSTN (Public Switched Telephone Network) modem, an Ethernet device, and/or various other types of wired and/or wireless network communication devices configured for communication with a network.

Figure 1B:
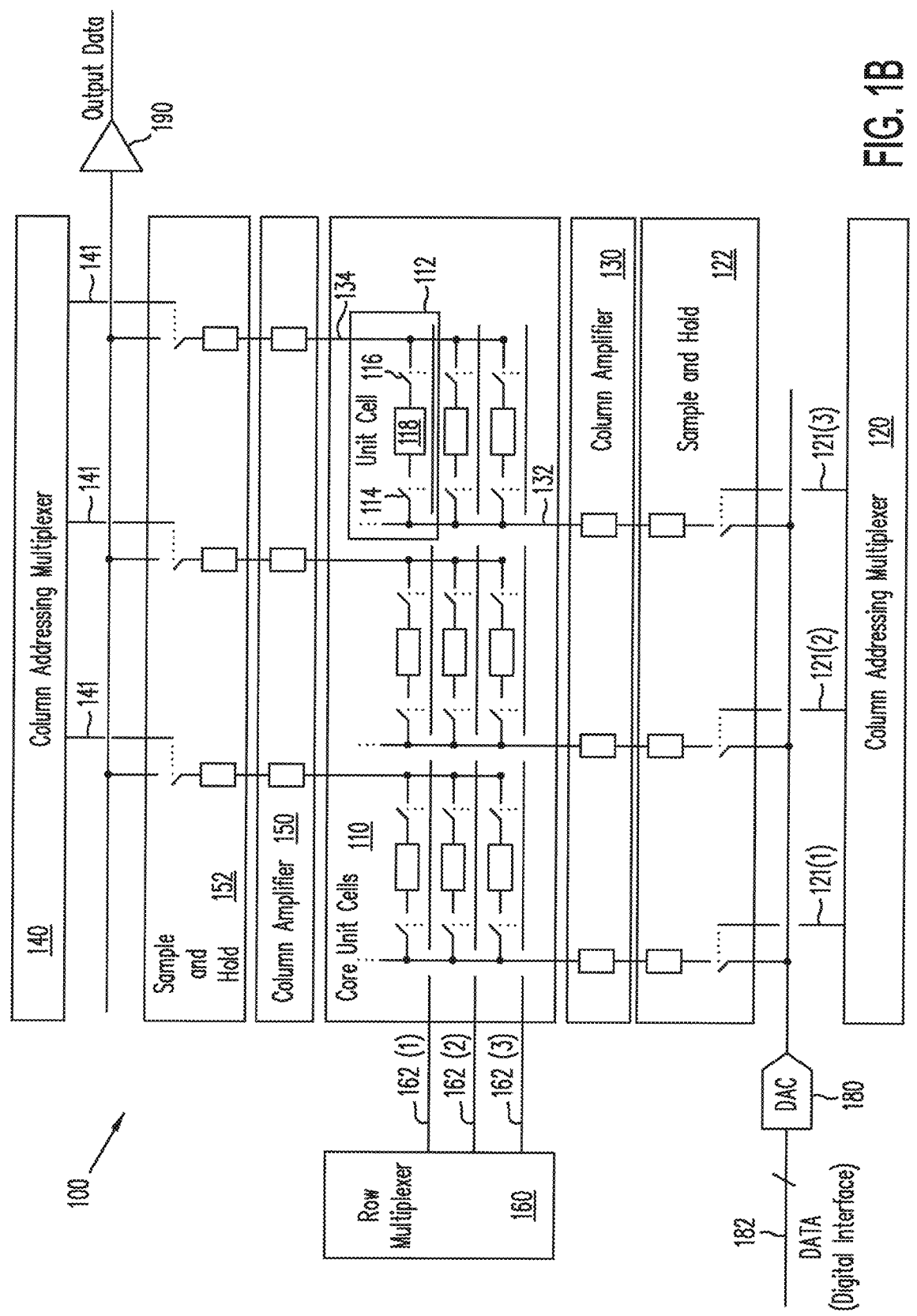
FIG. 1B illustrates a detailed block diagram of the focal plane array of FIG. 1A in accordance with an embodiment of the disclosure.

FIG. 1B illustrates a detailed block diagram of FPA 100 in accordance with an embodiment of the invention. In addition to various components shown in FIG. 1A, FIG. 1B further illustrates column enable lines 121 and 141, sample and hold circuitry 122 and 152, column input lines 132, column output lines 134, and row enable lines 162.

Column addressing multiplexer 120 may operate sample and hold circuitry 122 through column enable lines 121 to selectively provide bias voltages from DAC 180 to one or more columns of unit cells 112 through column amplifiers 130 and column input lines 132.

As also shown in FIG. 1B, each unit cell 112 of unit cell array 110 may include an input switch 114, an output switch 116, and a main circuit 118 (e.g., which may include a detector and one or more capacitors as further described herein). Input switches 114 may be selectively closed by row multiplexer 160 through row enable lines 162 to provide bias voltages from column input lines 132 to one or more capacitors of main circuits 118. Input switches 114 may also be selectively opened to isolate one or more capacitors of main circuits 118 from column input lines 132 after the bias voltages are stored by one or more capacitors of main circuits 118. As a result, one or more capacitors of main circuits 118 may be effectively decoupled from column input lines 132 (e.g., decoupled from bias voltage supply circuitry) and thus may remain relatively noise free while unit cell array 110 detects one or more images during one or more integration periods.

As discussed, unit cells 112 may provide output signals in response to infrared radiation received by the detectors. Output switches 116 may be selectively closed by row multiplexer 160 through row enable lines 162 to provide the output signals such as output voltages or currents from detectors of main circuits 118 to column output lines 134. In one embodiment, input switches 114 and output switches 116 may be operated independently by different row enable lines 162. In another embodiment, input switches 114 and output switches 116 may be operated substantially simultaneously by shared row enable lines 162. Column addressing multiplexer 140 may operate sample and hold circuitry 152 through column enable lines 141 to selectively provide output signals from column output lines 134 to data output buffer 190.

Figure 1C:
FIG. 1C illustrates a particular implementation example of the focal plane array of FIG. 1A in accordance with an embodiment of the disclosure.

FIG. 1C illustrates a particular implementation example of FPA 100 with unit cell array 100 implemented as a 640 by 512 array (e.g., corresponding to 640 by 512 pixels) in accordance with an embodiment of the invention. Other array sizes are also contemplated (e.g., 1280 by 1024 pixels and/or other sizes). In addition to various components shown in FIGS. 1A and 1B, FIG. 1C further illustrates two DACs 180 and bond pads 193. In this regard, the two DACs 180, shown left and right respectively, may be used to provide a higher overall digital data interface rate than a single DAC 180 as used in the embodiments shown in FIGS. 1A and 1B. Also, in the particular embodiment shown in FIG. 1C, DAC data register load circuitry 184, timing generation circuitry 185, and bias coefficient memory 189 are implemented as part of FPA 100.

Figures 2A, 2B:
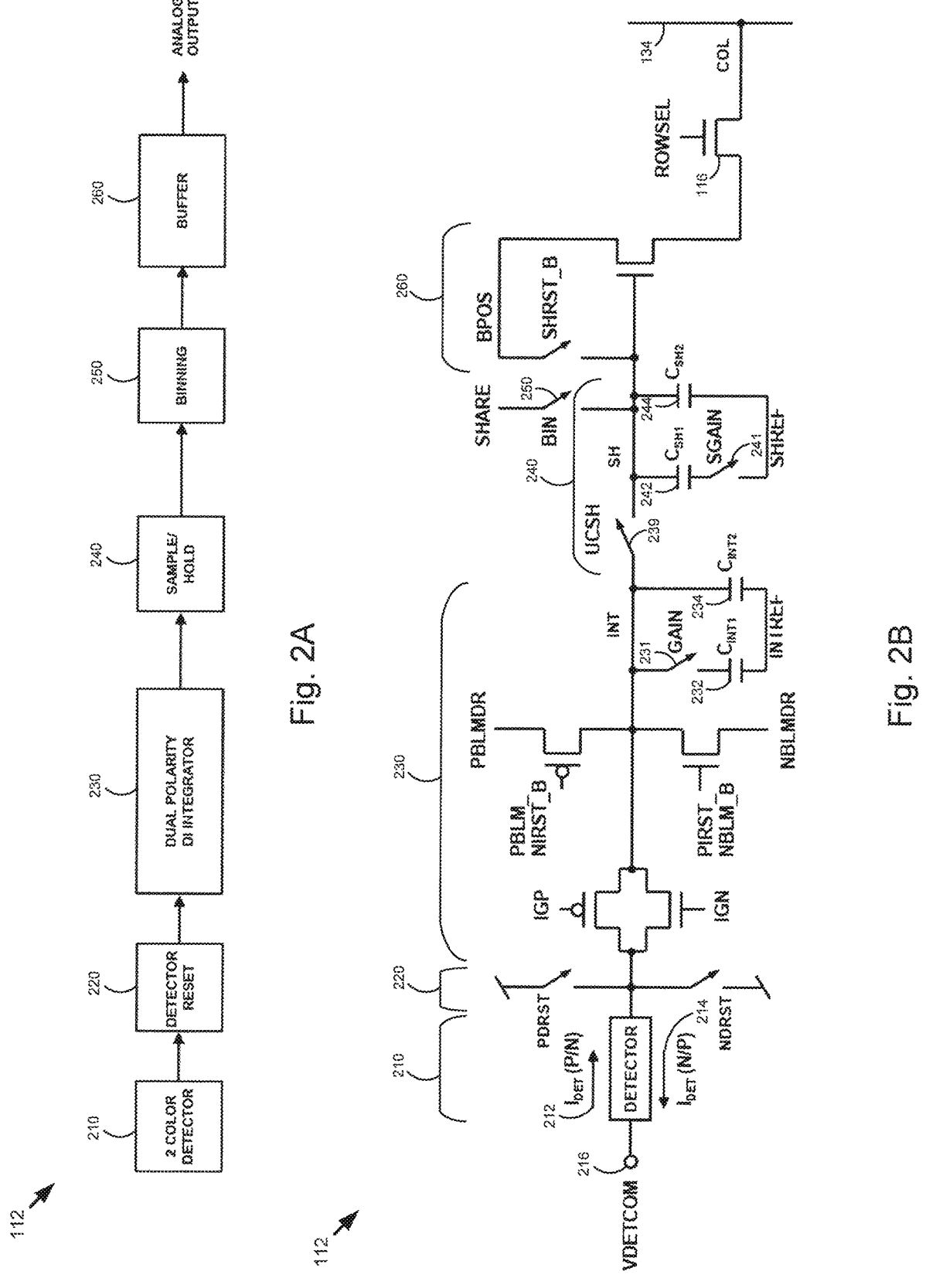
FIG. 2A illustrates a block diagram of a unit cell of the focal plane array of FIG. 1A in accordance with an embodiment of the disclosure.
FIG. 2B illustrates a circuit diagram of a unit cell of the focal plane array of FIG. 1A in accordance with an embodiment of the disclosure.

FIG. 2A illustrates a block diagram of a unit cell 112 of FPA 100 of FIG. 1A in accordance with an embodiment of the disclosure. FIG. 2B illustrates a circuit diagram of a unit cell 112 of FPA 100 of FIG. 1A in accordance with an embodiment of the disclosure. FIGS. 2A and 2B will be discussed together.

As shown, unit cell 112 includes a detector 210, a reset circuit 220, an integration circuit 230, a sample-hold circuit 240, a binning circuit 250, a buffer circuit 260, and output switch 116.

Detector 210 may be implemented as a diode providing a P-N junction that may be selectively operated in a forward direction (e.g., P-on-N operation) with current 212 or in a reverse direction (e.g., N-on-P operation) with current 214. In this regard, a voltage source 216 may be selectively toggled between positive and negative voltages corresponding to the current flows. In some embodiments, currents 212 and 214 may be integrated to store associated voltages in response to first and second wavelength ranges, respectively, using direct injection techniques.

Detector 210 may be a multi-band detector responsive to different wavelengths depending on the voltage bias provided by voltage source 216. For example, when voltage source 216 is positive, infrared radiation corresponding to a first wavelength range incident on detector 210 may cause current 212 to flow proportional to the amount of first wavelength infrared radiation received. Conversely, when voltage source 216 is negative, infrared radiation corresponding to a second wavelength range incident on detector 210 may cause current 214 to flow proportional to the amount of second wavelength infrared radiation received.

In various embodiments, detector 210 may be implemented with appropriate materials to provide a tuned response to various wavelength ranges. Any desired wavelength ranges may be used in accordance with the present disclosure (e.g., various infrared wavelength ranges including near infrared, mid infrared (e.g., midwave), far infrared, and/or others as appropriate). For ease of discussion only, first and second midwave wavelength ranges will be discussed (e.g., further labeled blue and red, respectively, for convenience and not corresponding to literal blue and red colors). However, it will be appreciated that any appropriate wavelength ranges, including infrared, thermal, visible light, ultraviolet, and/or others may be used as appropriate.

Reset circuit 220 is configured to selectively reset capacitors 232 and 234 of integration circuit 230 and capacitors 242 and 244 of sample-hold circuit 240.

Integration circuit 230 integrates a voltage on capacitors 232 and 234 in response to currents 212 and 214 (e.g., capacitor 232 may be selectively connected by a gain switch 231 to provide a gain adjustment) during an integration period to capture an image. The stored voltage corresponds to a pixel value for a single pixel of the image associated with the unit cell 112 and may be further converted to digital form (e.g., a count) by additional circuits as appropriate.

Integration circuit 230 passes the voltage to sample-hold circuit 240 through switch 239 for storage by capacitors 242 and 244 (e.g., capacitor 232 may be selectively connected by a gain switch 231 to provide a gain adjustment) while integration circuit 230 performs its next integration. The voltage stored by sample-hold circuit 240 may be shared with other circuits as appropriate through binning circuit 250 and passed through buffer 260 and output switch 116 to column output line 134.

By including both integration circuit 230 and sample-hold circuit 240, a voltage corresponding to a pixel value of a previous image stored by capacitors 242 and 244 of sample-hold circuit 240 may be read out of unit cell 112 while the next voltage corresponding to a pixel value of a current image may be integrated and stored by capacitors 232 and 234 of integration circuit 230. However, performing such integrate-while-read operations while transitioning (e.g., switching) image capture between the first and second wavelength ranges can result in parasitic coupling due to cross-talk between capacitors 232/234 of integration circuit 230 and capacitors 242/244. For example, this can be exhibited by an infrared image associated with a different wavelength range (e.g., first or second) than the wavelength range (e.g., second or first) of the immediately prior infrared image. The effects of such parasitic coupling may be compensated for using correction terms as discussed herein.

As discussed, detector 212 may be a dual band detector configurable to be operated in single band mode or dual band mode. In single band mode, voltage source 216 is operated with only a positive voltage or only a negative voltage when capturing voltages corresponding to pixel values for successive images. As a result, FPN associated with single band pixel values captured by FPA 100 may be corrected using single band NUC terms. As discussed, different sets of NUC terms may be used depending on which of the two dual bands is being used in single band mode. For example, when detector 212 is operated in a forward direction corresponding to current 212, a first set of single band NUC terms may be used corresponding to images captured in the wavelength range captured in the forward direction single band operating mode. Conversely, when detector 212 is operated in a reverse direction corresponding to current 214, a second set of single band NUC terms may be used corresponding to images captured in the wavelength range captured in the reverse direction single band operating mode.

In dual band mode, voltage source 216 alternates between positive and negative voltages when capturing pixel values for successive images. As discussed, the pixel values captured in this alternating manner may exhibit different FPN than the images captured in single band mode. In particular, as unit cell 112 switches between capturing different wavelength ranges in successive images, undesired parasitic coupling may occur between capacitors 232/234 of integration circuit 230 and capacitors 242/244 of sample-hold circuit 240. As a result of this parasitic coupling, voltages captured for pixel values of the same wavelength range can vary depending on whether unit cell 112 is operated in single band mode or dual band mode.

Figure 3A:
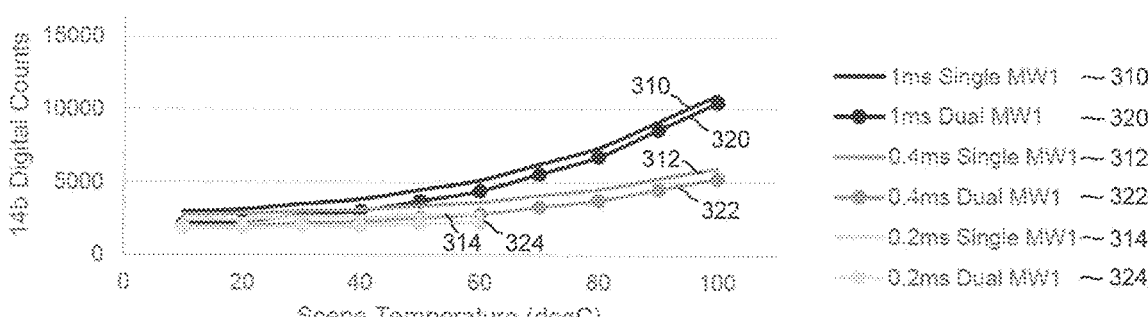
FIGS. 3A-B illustrate responses of various infrared detectors in single band and dual band modes in accordance with embodiments of the disclosure.
Figure 3B:
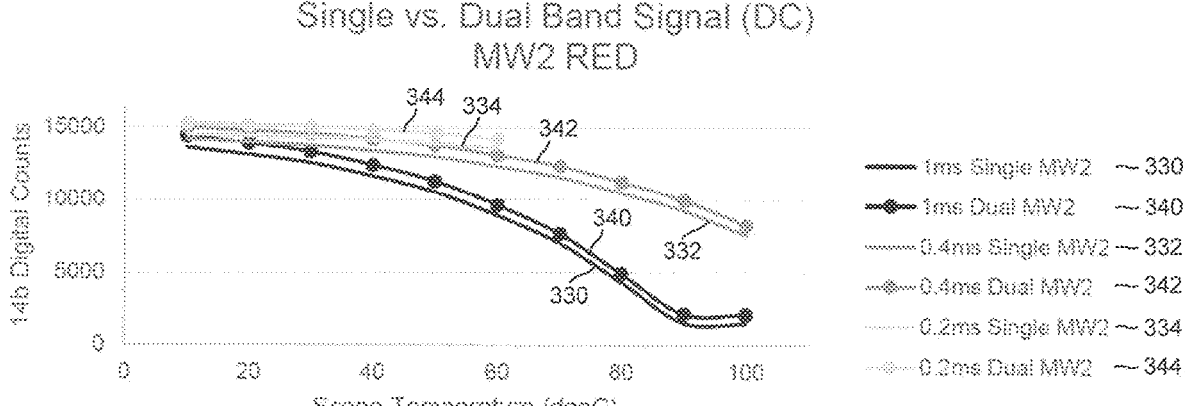

For example, FIGS. 3A-B illustrate responses of detectors 210 operated in single band and dual band modes when capturing scenes of various temperatures in accordance with embodiments of the disclosure. In FIG. 3A, plots 310, 312, and 314 illustrate mean pixel values (e.g., 14 bit digital counts after the captured voltages are converted to digital form) of infrared images captured by detectors 210 of unit cells 112 of FPA 100 operated in a single band mode in a forward direction with current 212 and corresponding to a first wavelength range (e.g., also referred to as a blue wavelength range as discussed). Plots 320, 322, and 324 illustrate mean pixel values of infrared images captured by detectors 210 operated in a dual band mode in a forward direction with current 212 and corresponding to the first wavelength range. Upon comparison, it will be appreciated that dual band plots 320, 322, and 324 exhibit lower pixel values (e.g., associated with lower captured voltages) than single band plots 310, 312, and 314. These lower pixel values may be associated with the undesired parasitic coupling discussed above that is present in the forward operation of detectors 210 in dual band mode.

In FIG. 3B, plots 330, 332, and 334 illustrate mean pixel values of infrared images captured by detectors 210 operated in a single band mode in a reverse direction with current 214 and corresponding to a second wavelength range (e.g., also referred to as a red wavelength range). Plots 340, 342, and 344 illustrate mean pixel values of infrared images captured by detectors 210 operated in a dual band mode in a reverse direction with current 214 and corresponding to the second wavelength range. Upon comparison, it will be appreciated that dual band plots 340, 342, and 344 exhibit higher pixel values (e.g., associated with higher captured voltages) than single band plots 330, 332, and 334. These higher pixel values may be associated with the undesired parasitic coupling discussed above that is present in the reverse operation of detectors 210 in dual band mode.

Thus, it will be appreciated that applying single band NUC terms to infrared images captured in dual band mode may not correctly compensate for all FPN due to the different voltages captured between single band and dual band modes when imaging the same scene. Accordingly, as discussed, in some cases particular NUC terms may be provided to compensate for the different FPN present in dual band mode. However, as also discussed, such additional NUC terms can require additional processing operations to determine and additional memory for storage that may be prohibitive in some implementations.

These various single band and dual band NUC techniques can be further understood in relation to FIGS. 4A-F which illustrate infrared images captured of a uniform black body and corrected with various NUC techniques in accordance with embodiments of the disclosure.

Figures 4A, 4B, 4C, 4D, 4E, 4F:
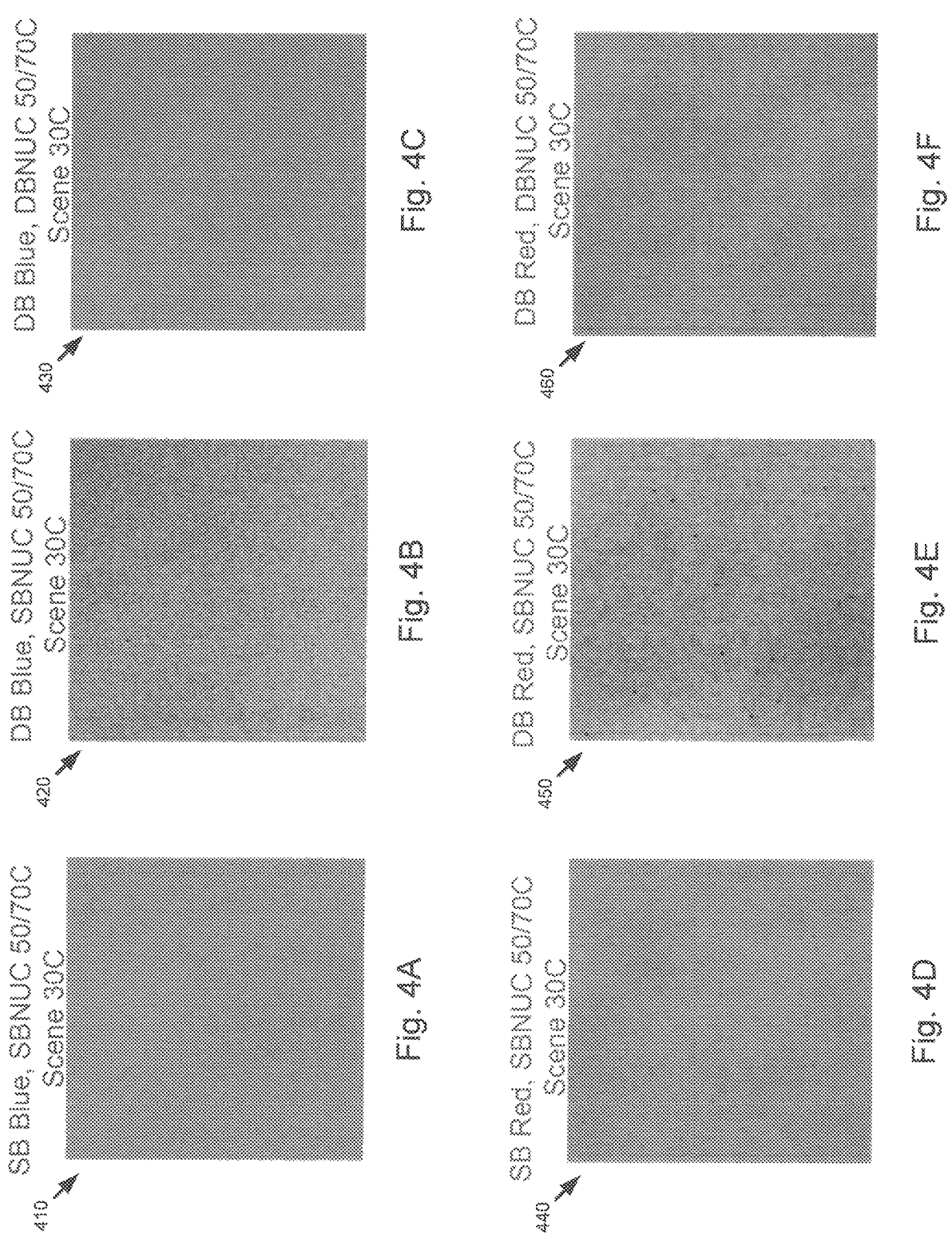
FIGS. 4A-F illustrate infrared images corrected with various NUC techniques in accordance with embodiments of the disclosure.

FIG. 4A illustrates an infrared image 410 captured by unit cells 112 with detectors 210 operating in a single band mode in a forward direction with current 212 and corresponding to the first wavelength range. Infrared image 410 is captured within a series of infrared images all captured with detectors 210 operating in the single band mode in the forward direction. In infrared image 410, NUC terms associated with the single band operation and the first wavelength range have been applied. As a result, infrared image 410 exhibits substantially uniform pixel values corresponding to the first wavelength range.

FIG. 4B illustrates an infrared image 420 captured by unit cells 112 with detectors 210 operating in a dual band mode in a forward direction with current 212 and corresponding to the first wavelength range. Infrared image 420 is captured within a series of infrared images captured with detectors 210 operating in alternating dual band configurations. In this regard, other infrared images captured immediately prior to and immediately after infrared image 420 are captured with detectors operating in a dual band mode in a reverse direction with current 214 and corresponding to the second wavelength range. In infrared image 420, NUC terms associated with the single band operation and the first wavelength range have been applied. However, as discussed, the dual band operation of detectors 210 introduces different FPN. Therefore, the single band NUC terms do not entirely compensate for this different FPN. As a result, infrared image 420 exhibits FPN in the form of spatial nonuniformities as shown in FIG. 4B, even though the single band NUC terms for the first wavelength range have been applied.

FIG. 4C illustrates an infrared image 430 captured in the manner of infrared image 420 of FIG. 4B, but with different NUC terms applied, namely NUC terms specifically provided for detectors 210 operating in the forward direction in dual band mode. As shown in FIG. 4C, infrared image 430 exhibits substantially uniform pixel values corresponding to the first wavelength range in a manner that improves upon the single band NUC terms applied to infrared image 420.

FIGS. 4D, 4E, and 4F illustrate similar infrared images 440, 450, and 460 applying the principles of FIGS. 4A, 4B, and 4C discussed above, respectively, for detectors 210 operating in a reverse direction with current 214 and corresponding to the second wavelength range. In infrared image 440, NUC terms associated with the single band operation and the second wavelength range have been applied. As a result, infrared image 440 exhibits substantially uniform pixel values corresponding to the second wavelength range.

In infrared image 450, NUC terms associated with the single band operation and the second wavelength range have been applied. However, as discussed, the dual band operation of detectors 210 introduces different FPN. Therefore, the single band NUC terms do not entirely compensate for this different FPN. As a result, infrared image 450 exhibits FPN in the form of spatial nonuniformities as shown in FIG. 4E, even though the single band NUC terms for the second wavelength range have been applied.

Infrared image 460 exhibits substantially uniform pixel values corresponding to the second wavelength range in a manner that improves upon the single band NUC terms applied to infrared image 450.

Thus, it will be appreciated that applying single band NUC terms to infrared images captured in dual band mode does not remove non-uniformities as effectively as applying single band NUC terms to single band images or applying dual band NUC terms to dual band images. However, as also discussed, determining and storing dedicated dual band NUC terms can be prohibitive in some implementations.

Various approaches are presently disclosed to compensate for the different FPN introduced during dual band mode operation without requiring the provisioning or use of dedicated dual band NUC terms. In some embodiments, the different voltages captured during dual band mode may be characterized and compensated for using global and/or pixel-wise corrections that depend upon image-to-image differences in dual band infrared images captured for alternating wavelength ranges.

Figure 5:
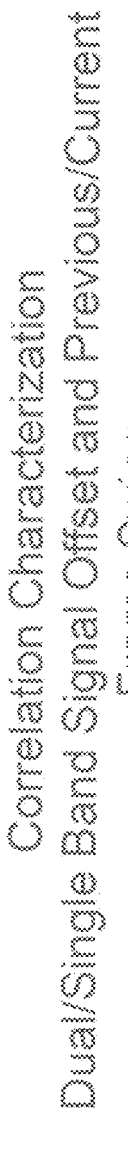
FIG. 5 illustrates correlations between image-to-image mean differences and offset values to compensate for FPN introduced during dual band mode image capture in accordance with an embodiment of the disclosure.

For example, FIG. 5 illustrates correlations between image-to-image mean differences and offset values to compensate for FPN introduced during dual band mode operation in accordance with an embodiment of the disclosure. In this regard, infrared images may be captured by FPA 100 with detectors 210 operating in single band mode for the first wavelength range. Additional infrared images may be captured by FPA 100 with detectors 210 operating in single band mode for the second wavelength range. Further infrared images may be captured by FPA 100 with detectors 210 operating in dual band mode for the first and second wavelength ranges (e.g., alternating between the first and second wavelength ranges). These operations may be repeated using different integration times (e.g., 1 millisecond, 4 milliseconds, and/or others).

These various images may be compared with each other to provide the plots shown in FIG. 5. For example, a difference (e.g., also referred to as an offset value) in the mean pixel values (e.g., average pixel value across the entire infrared image) of the single and dual band mode images of the same wavelength range may be calculated which corresponds to the Y axis in FIG. 5. In addition, for the same dual band mode image, a difference in the mean pixel values of the dual band mode image and the immediately preceding dual band mode image may be calculated which corresponds to the X axis in FIG. 5 (e.g., the difference between a current first wavelength range dual band mode image and the previous second wavelength range dual band mode image, or vice versa).

In this regard, plots 510, 512, 514, 520, 522, and 524 identify offset values as a function of the image-to-image differences as discussed above. In particular, plots 510, 512, and 514 are associated with the first wavelength range, and plots 520, 522, and 524 are associated with the second wavelength range. Plots 530, 534, 540, and 544 are linear extrapolations (e.g., linear fits) of plots 510, 514, 520, and 524, respectively, and correspond to specific linear equations as illustrated in FIG. 5.

Upon review of FIG. 5, it will be appreciated that there is a correlation between the dual band mode image-to-image mean pixel differences and the offset exhibited by dual band mode images in relation to single band mode images of the same wavelength range. In particular, for the first wavelength range (plots 510, 512, 514, 530, 534) there is a consistent negative offset that increases substantially linearly as a function of the image-to-image mean pixel differences. For the second wavelength range (plots 520, 522, 524, 540, 544) there is a consistent positive offset that decreases substantially linearly as a function of the image-to-image mean pixel differences. It will be appreciated that these offsets are consistent with the plots shown in FIG. 3A (e.g., wherein the dual band first wavelength range images exhibit consistently lower pixel values than single band first wavelength range images) and in FIG. 3B (e.g., wherein the dual band second wavelength range images exhibit consistently higher pixel values than single band second wavelength range images).

Taking the four linear equations of FIG. 5 together, a single equation 1 can be provided that approximates a collective best fit (e.g., linear estimation) of the linear extrapolations of plots 530, 534, 540, and 544 as follows:

$$\text{offset} = (-0.014)(x_{i,j}) +/- 650 \text{ counts} \qquad \text{(equation 1)}$$

In equation 1, offset is the variation in mean pixel values associated with dual band mode operation. $x_{i,j}$ is the image-to-image difference in mean pixel values of the current dual band mode infrared image in relation to the immediately prior dual band mode infrared image (e.g., the x axis of FIG. 5). (−0.014) is a linear gain factor applied to the dual band mode image-to-image mean pixel difference. The 650 counts are a negative constant for first wavelength range dual band mode images and a positive constant for second wavelength range dual band mode images, consistent with the above discussion. Thus, the pixel value offset associated with dual band mode images may be calculated by multiplying the image-to-image mean pixel difference ($x_{i,j}$) by linear gain factor (−0.014) and subtracting (for first wavelength range dual band mode images) or adding (for first wavelength range dual band mode images) a constant, namely 650 counts.

Accordingly, to counteract the effects of FPN in dual band operation, the offset of equation 1 may be calculated for each dual band infrared image (e.g., in realtime and/or in post processing by logic device 108 and/or other local or remote components as appropriate) and a dual band correction term (e.g., an opposite value of the calculated offset) may be applied to all pixels of each dual band infrared image to reduce the FPN associated with dual band operation. Single band NUC terms may also be applied for additional correction.

In the above-described embodiment, the offset and resulting dual band correction term are calculated using mean pixel values of the various images as discussed. As a result, the dual band correction term is applied globally to all pixel values of a dual band infrared image.

In another embodiment, the offset and dual band correction terms are calculated in a pixel-wise manner such that an offset and corresponding dual band correction term are determined for each individual pixel of each dual band infrared image. For example, the offsets for individual pixels (e.g., at pixel locations i, j) of dual band images of the first wavelength (e.g., blue) range may be calculated as follows:

$$\text{offset}_{blue} = (m_{i,j\ blue})(z_{i,j}) + b_{i,j\ blue} \qquad \text{(equation 2)}$$

In equation 2, offset$_{blue}$ is the variation in an individual pixel value at pixel location i, j of the first wavelength infrared image captured during dual band operation that differs from a first wavelength infrared image captured during single band operation of the same scene. $z_{i,j}$ is the image-to-image pixel difference of the pixel values at pixel location i, j of the first wavelength infrared image in relation to the immediately prior second wavelength infrared image both captured during dual band mode operation. $m_{i,j\ blue}$ is a linear gain factor as similarly discussed above but applied to an individual pixel at pixel location i, j of the first wavelength infrared image captured during dual band operation. $b_{i,j\ blue}$ is a constant as similarly discussed above but applied to an individual pixel at pixel location i, j of the first wavelength infrared image captured during dual band operation.

The offsets for individual pixels of dual band images of the second wavelength (e.g., red) range may be calculated as follows:

$$\text{offset}_{red} = (m_{i,j\ red})(z_{i,j}) + b_{i,j\ red} \qquad \text{(equation 3)}$$

It will be appreciated that equation 3 is similar to equation 2 but with terms associated with the second wavelength range.

The various pixel-wise gains and constants calculated in equations 2 and 3 can be further appreciated upon review of FIGS. 6A-D which illustrate histograms of pixel-wise gain values and constant values to compensate for FPN introduced during dual band mode operation in accordance with embodiments of the disclosure.

Figures 6A, 6B, 6C, 6D:
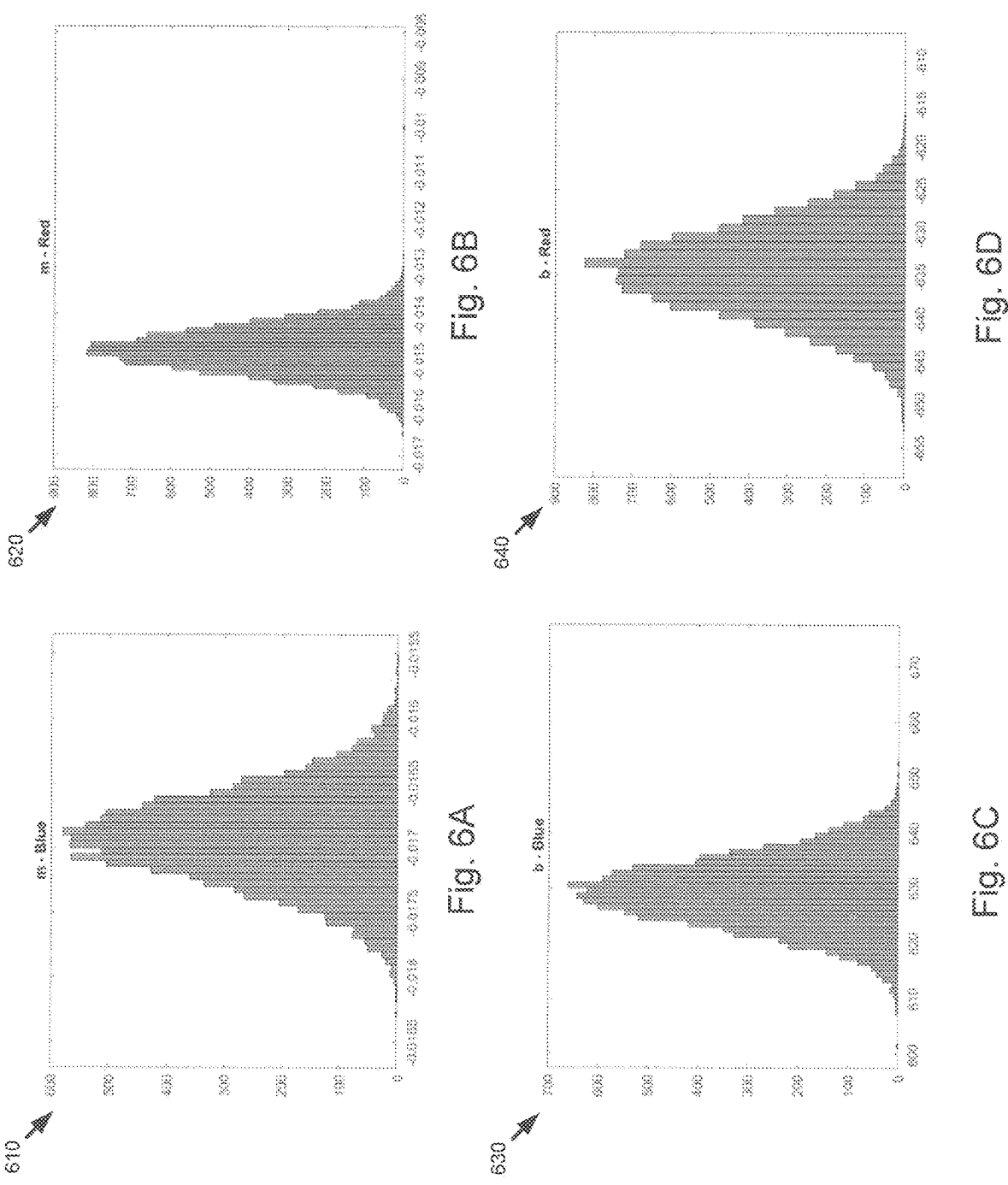
FIGS. 6A-D illustrate histograms of pixel-wise gain values and constant values to compensate for FPN introduced during dual band mode image capture in accordance with embodiments of the disclosure.

For example, FIG. 6A illustrates a histogram 610 identifying the distribution of gain terms $m_{i,jblue}$ of equation 2 for the pixels of a dual band first wavelength infrared image. FIG. 6B illustrates a histogram 620 identifying the distribution of gain terms $m_{i,j\ red}$ of equation 3 for the pixels of a dual band second wavelength infrared image. FIG. 6C illustrates a histogram 630 identifying the distribution of constant terms $b_{i,j\ blue}$ of equation 2 for the pixels of a dual band first wavelength infrared image. FIG. 6D illustrates a histogram 640 identifying the distribution of constant terms $b_{i,j\ red}$ of equation 3 for the pixels of a dual band second wavelength infrared image.

Although the calculation and storage of pixel-wise offsets in accordance with equations 2 and 3 may utilize additional resources and memory storage in comparison with global offsets in accordance with equation 1, they can provide improved results. In addition, the pixel-wise offsets may be used consistently over various integration times, gain modes, and/or other configurations of FPA 100 and therefore may still require less resources and memory storage than dedicated dual band NUC terms (e.g., which may require many different sets of NUC terms for various operational configurations of FPA 100).

The results of the various correction techniques described herein may be further appreciated upon review of FIGS. 7A-E and FIGS. 8A-E. In particular, FIGS. 7A-E illustrate infrared images corrected with various NUC techniques for the first wavelength range in accordance with embodiments of the disclosure. FIGS. 8A-E illustrate infrared images corrected with various NUC techniques for the second wavelength range in accordance with embodiments of the disclosure.

Figures 7A, 7B, 7C, 7D, 7E:
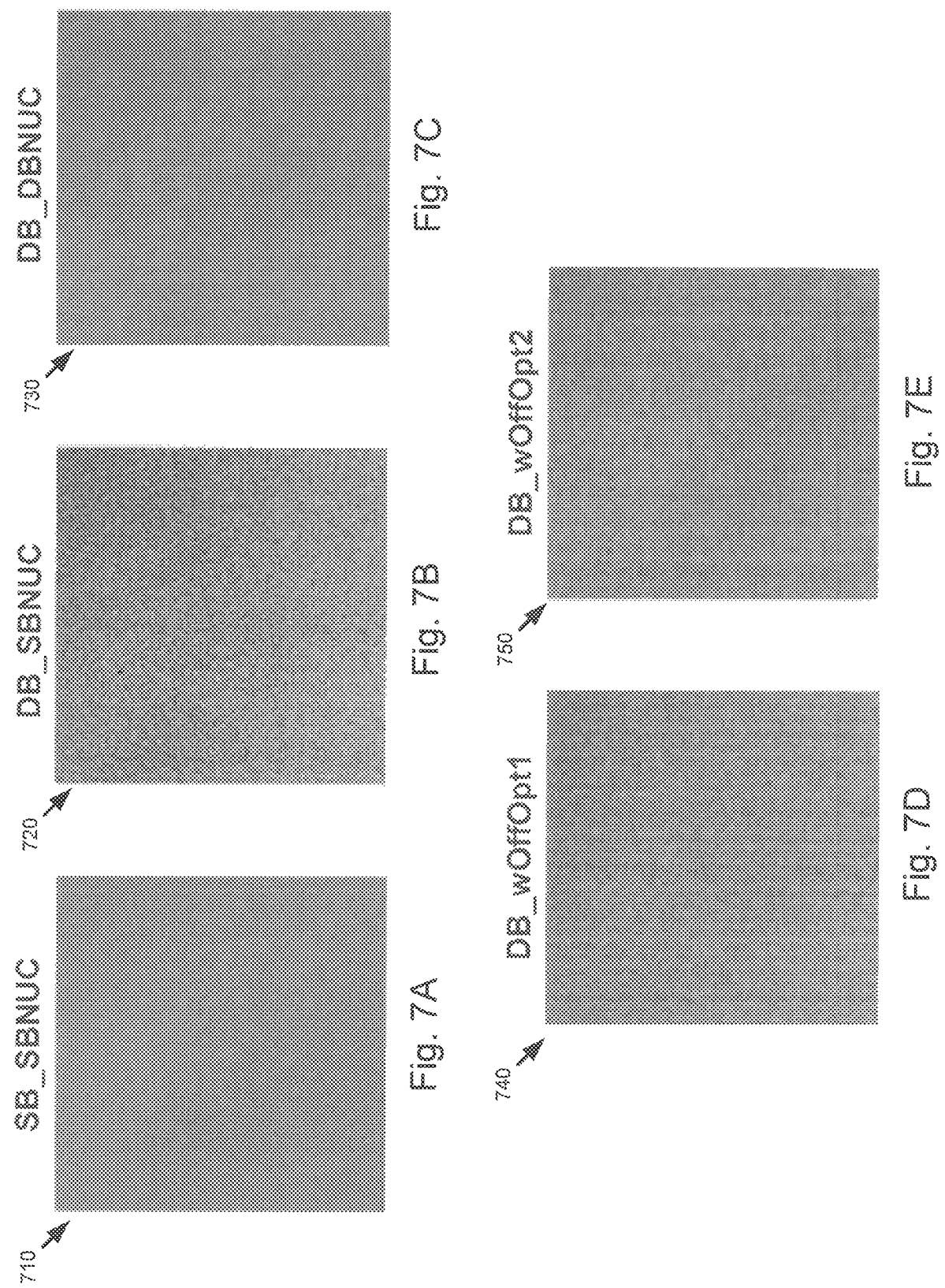
FIGS. 7A-E illustrate infrared images corrected with various NUC techniques for a first wavelength range in accordance with embodiments of the disclosure.
Figures 8A, 8B, 8C, 8D, 8E:
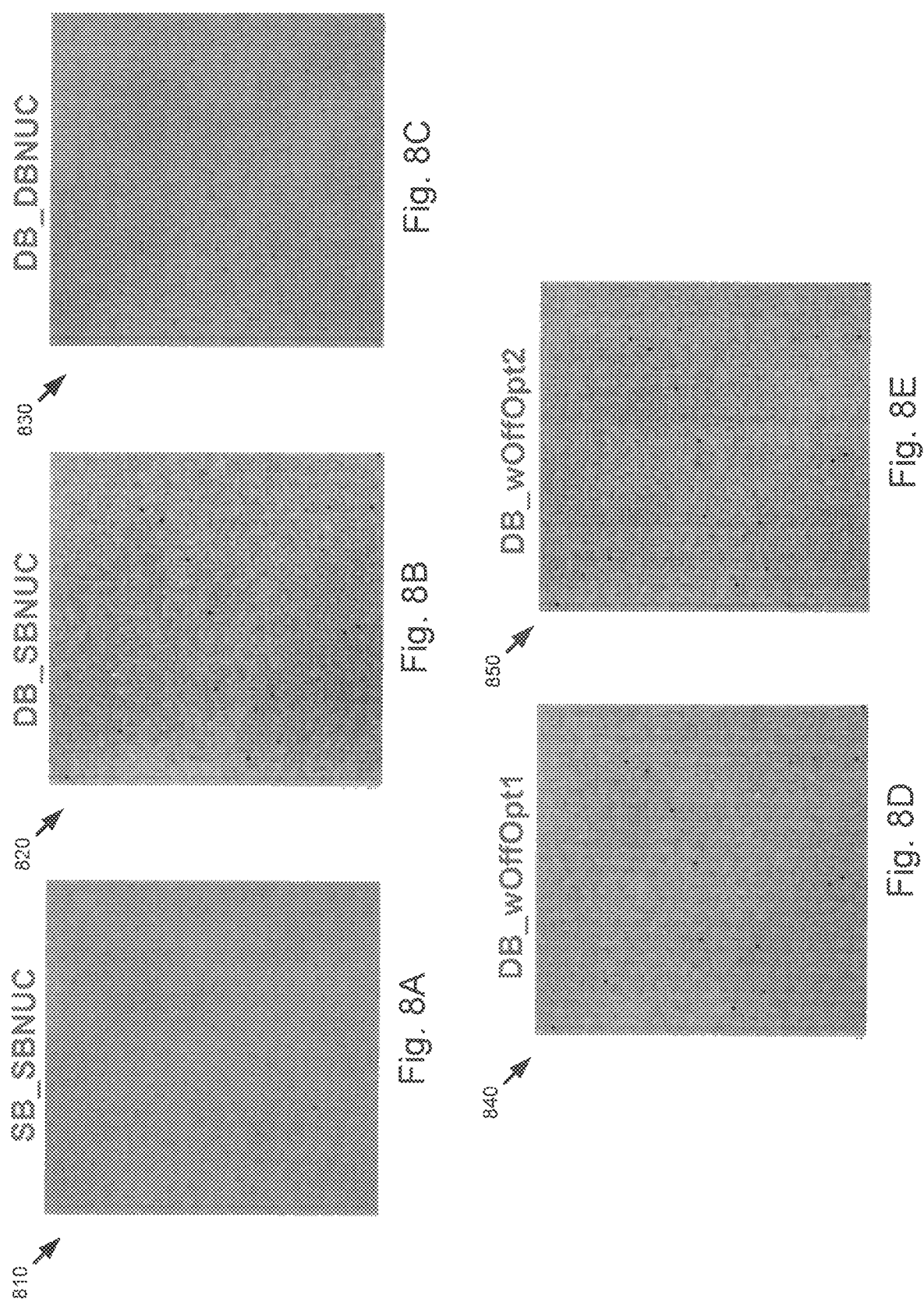
FIGS. 8A-E illustrate infrared images corrected with various NUC techniques for a second wavelength range in accordance with embodiments of the disclosure.

FIG. 7A illustrates an infrared image 710 captured in a single band mode for the first wavelength range and with NUC terms associated with the single band operation and the first wavelength range applied, similar to infrared image 410 of FIG. 4A. As a result, infrared image 710 exhibits substantially uniform pixel values corresponding to the first wavelength range.

FIG. 7B illustrates an infrared image 720 captured in a dual band mode for the first wavelength range and with NUC terms associated with the single band operation and the first wavelength range applied, similar to infrared image 420 of FIG. 4B. However, infrared image 720 exhibits FPN in the form of spatial nonuniformities as shown in FIG. 7B due to the FPN associated with dual band mode, even though the single band NUC terms for the first wavelength range have been applied.

FIG. 7C illustrates an infrared image 730 captured in the manner of infrared image 720 of FIG. 7B, but with NUC terms associated with the dual band mode for the first wavelength range applied, similar to infrared image 430 of FIG. 4C. As a result, infrared image 730 exhibits substantially uniform pixel values corresponding to the first wavelength range in a manner that improves upon the single band NUC terms applied to infrared image 720.

FIG. 7D illustrates an infrared image 740 captured in the manner of infrared image 720 of FIG. 7B, with NUC terms associated with the single band operation and the first wavelength range applied, and further with a global offset applied in accordance with the mean pixel techniques discussed with regard to FIG. 5 and equation 1. As shown, infrared image 740 exhibits substantially reduced FPN in comparison to infrared image 720.

FIG. 7E illustrates an infrared image 750 captured in the manner of infrared image 720 of FIG. 7B, with NUC terms associated with the single band operation and the first wavelength range applied, and further with pixel-wise offsets applied in accordance with the pixel-wise techniques discussed with regard to FIGS. 6A and 6C and equation 2. As shown, infrared image 750 exhibits substantially reduced FPN in comparison to infrared image 720 and also in comparison to infrared image 740.

FIGS. 8A-E illustrate infrared images 810-850 similar to infrared images 710-750, respectively, for the second wavelength range. In particular, infrared image 840 (e.g., with NUC terms associated with the single band operation and the second wavelength range applied and further with a global offset applied in accordance with the mean pixel techniques discussed with regard to FIG. 5 and equation 1) exhibits substantially reduced FPN in comparison to infrared image 820. Similarly, infrared image 850 (e.g., with NUC terms associated with the single band operation and the second wavelength range applied, and further with pixel-wise offsets applied in accordance with the pixel-wise techniques discussed with regard to FIGS. 6B and 6D and equation 3) exhibits substantially reduced FPN in comparison to infrared image 820 and also in comparison to infrared image 840.

Figure 9A:
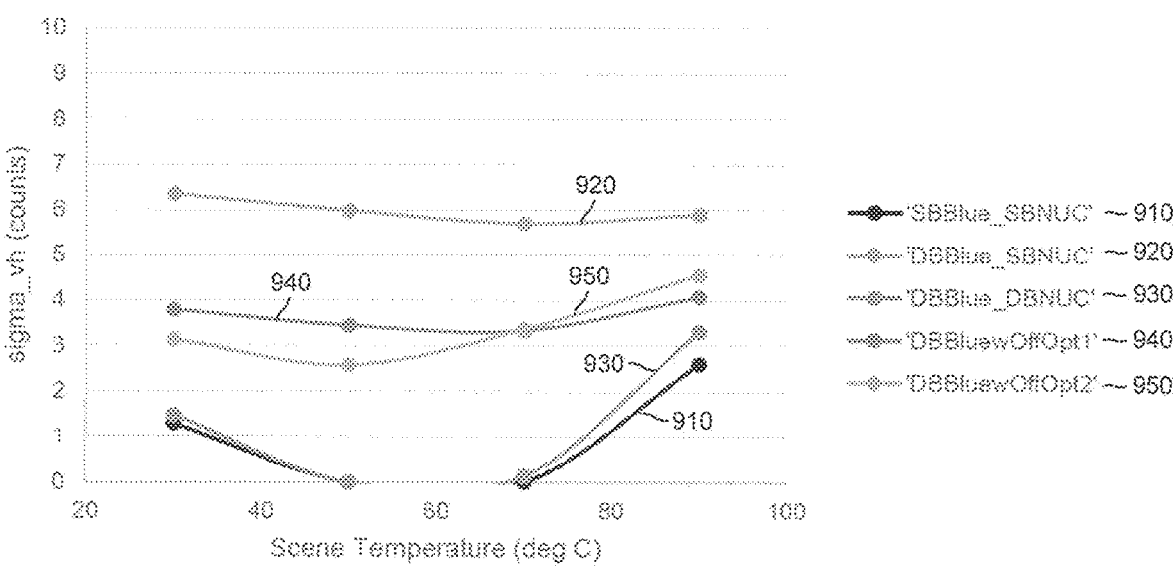
FIGS. 9A-B illustrate plots of FPN measurements associated with the images of FIGS. 7A-E and FIGS. 8A-E in accordance with embodiments of the disclosure.
Figure 9B:
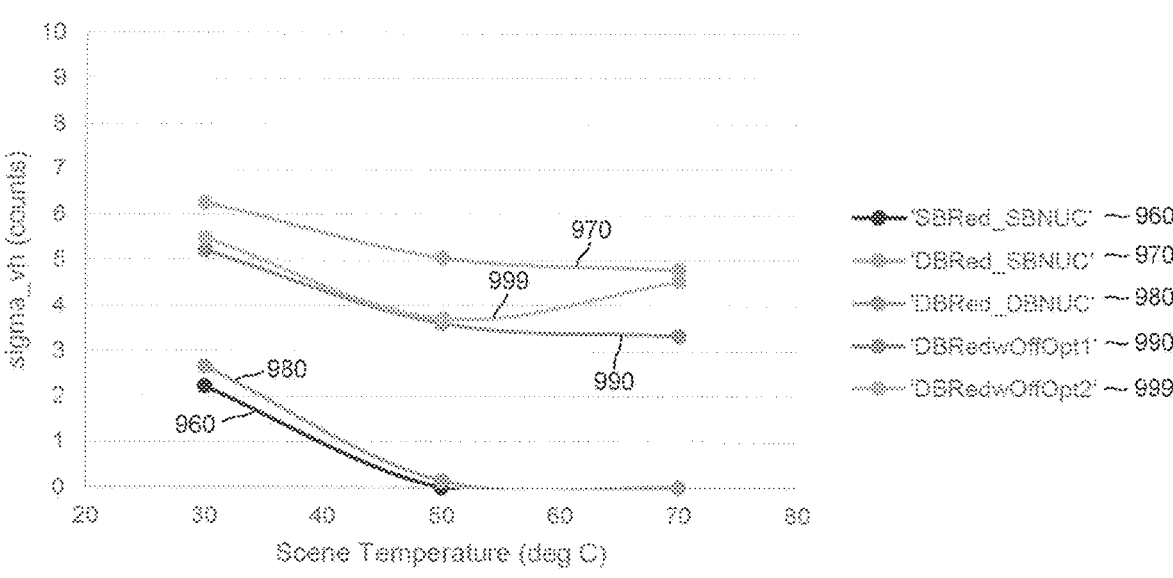

FIGS. 9A-B illustrate plots of FPN measurements associated with the images of FIGS. 7A-E and FIGS. 8A-E in accordance with embodiments of the disclosure. In particular, plots 910-950 are associated with infrared images 710-750, respectively, and plots 960-999 are associated with infrared images 810-850, respectively.

As shown, plots 920 and 970 (e.g., corresponding to dual band images corrected with single band NUC terms) exhibit the greatest amount of FPN. Plots 910 and 960 (e.g., corresponding to single band images corrected with single band NUC terms) exhibit the least amount of FPN. Plots 930 and 980 (e.g., corresponding to dual band images corrected with dual band NUC terms) exhibit very little FPN and are closely aligned with plots 910 and 960. Plots 940 and 990 (e.g., corresponding to dual band images corrected with single band NUC terms and further corrected with a global offset in accordance with the mean pixel techniques discussed herein) exhibit an intermediate amount of FPN, but still substantially less FPN than plots 920 and 970. Similarly, plots 950 and 999 (e.g., corresponding to dual band images corrected with single band NUC terms and further corrected with pixel-wise offsets applied in accordance with the pixel-wise techniques discussed herein) also exhibit an intermediate amount of FPN, but still substantially less FPN than plots 920 and 970.

In particular, it will be appreciated that the global offset and the pixel-wise offset approach may each perform better than each other depending on wavelength range and scene temperature. However, in all cases, both approaches still outperform plots 920 and 970.

Thus, it will be appreciated that by applying the global offset and/or pixel-wise offset correction techniques discussed herein and single band NUC terms to dual band images, reduced FPN can be achieved over conventional approaches that apply single band NUC terms alone. In addition, such improvement may be achieved without requiring the additional processing resources and memory associated with dual band NUC terms as discussed.

Figure 10:
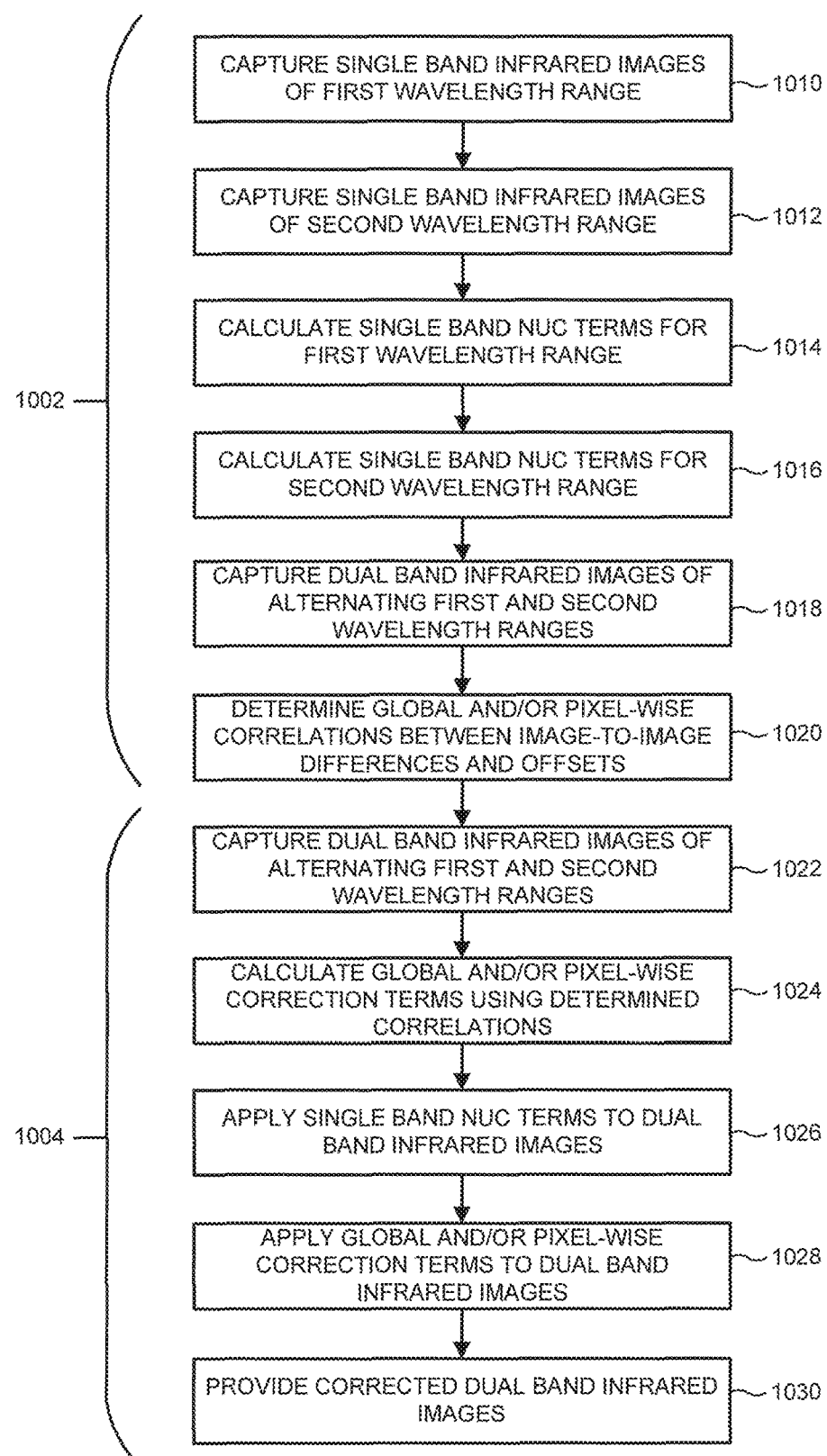
FIG. 10 illustrates a process of compensating for FPN associated with dual band operation of infrared detectors in accordance with an embodiment of the disclosure.

FIG. 10 illustrates a process 1000 of compensating for FPN associated with dual band operation of detectors 212 in accordance with an embodiment of the disclosure. The operations of process 1000 may be performed by various components of camera 101 as appropriate. Although various operations are illustrated and discussed in order, any of the various operations may be reordered and/or performed simultaneously as appropriate in various implementations.

As shown, process 1000 includes: a training stage 1002 where the single band NUC terms are calculated and correlations as discussed with regard to equations 1, 2, and/or 3 are determined; and an application stage 1004 where infrared images are corrected using the single band NUC terms and offsets calculated using the correlations.

In some embodiments, the various capturing operations of blocks 1010, 1012, and 1018 further discussed herein may capture images of the same scene (e.g., a uniform blackbody and/or other scene) to facilitate determination of single band NUC terms and determination of correlations between image-to-image differences and offsets.

Referring to training stage 1002, in blocks 1010 and 1012, detectors 212 of unit cells 112 of FPA 100 capture a plurality of single band infrared images of the first wavelength range and of the second wavelength range, respectively.

In blocks 1014 and 1016, logic device 108 calculates single band NUC terms for the first wavelength range and the second wavelength range using the single band infrared images captured in blocks 1010 and 1012, respectively. The single band NUC terms may be stored, for example, in memory 109. In some embodiments, the single band NUC terms may be calculated in accordance with various techniques identified in U.S. Pat. No. 9,208,542 issued Dec. 8, 2015 which is hereby incorporated by reference in its entirety.

In block 1018, detectors 212 of unit cells 112 of FPA 100 capture a plurality of dual band infrared images of the first and second wavelength ranges. In block 1020, logic device 108 determines global and/or pixel-wise correlations between image-to-image differences and offsets as discussed with regard to equations 1, 2, and/or 3. The correlations may be stored, for example, in memory 109. Thus, following the conclusion of training stage 1002 in block 1020, single band NUC terms and image-to-image correlations will be available for each of the first and second wavelength ranges for use in application stage 1004.

Referring to application stage 1004, in block 1022, detectors 212 of unit cells 112 of FPA 100 capture dual band infrared images of the first and second wavelength ranges. In block 1024, logic device 108 calculates global and/or pixel-wise correction terms for the dual band infrared images using the correlations determined in block 1020. In block 1026, logic device 108 applies the single band NUC terms to the dual band images. In block 1028, logic device 108 further applies the global and/or pixel-wise correction terms to the dual band images to provide corrected dual band images.

Accordingly, in block 1030, the corrected dual band images may be provided by camera 101 on display 111, over communication interface 113, and/or otherwise. As discussed, the corrected dual band images reduce the FPN associated with dual band mode operation more than what is achievable by applying only single band NUC terms, and also with fewer processing and memory resources than would be required by conventional dedicated dual band NUC terms.

Where applicable, various embodiments provided by the present disclosure can be implemented using hardware, software, or combinations of hardware and software. Also, where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more computer readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A method comprising:
operating a plurality of infrared detectors in a dual band mode to capture infrared images alternating between a first wavelength range and a second wavelength range, wherein the operating comprises:
first wavelength range and a second wavelength range, wherein the operating comprises:

capturing a first infrared image corresponding to the first wavelength range,
switching the infrared detectors to respond to the second wavelength range, and
capturing a second infrared image corresponding to the second wavelength range;
determining a correlation between:
differences in pixel values of the first and second infrared images captured in the dual band mode, and
differences in pixel values exhibited by the second infrared image in relation to a third infrared image of the second wavelength range captured by the infrared detectors in a single band mode;
calculating, using the correlation, a correction term to compensate for dual band mode fixed pattern noise (FPN) in the second infrared image associated with the switching; and
applying the correction term to the second infrared image to reduce the dual band mode FPN.

2. The method of claim 1, wherein:
the infrared detectors are selectively configurable to operate in the dual band mode or the single band mode; and
the infrared detectors in the single band mode are configured to capture sequential infrared images in one of the first wavelength range or the second wavelength range.

3. The method of claim 2, wherein:
the correction term is a first correction term; and
the method further comprises applying a second correction term to the second infrared image to reduce single band mode FPN.

4. The method of claim 1, wherein the correction term is a global correction term applied to all pixels of the second infrared image.

5. The method of claim 1, wherein the correction term is one of a plurality of pixel-wise correction terms applied to corresponding pixels of the second infrared image.

6. The method of claim 1, wherein:
the infrared detectors are diodes comprising P-N junctions; and
the diodes are selectively configurable to pass currents in a first direction responsive to the first wavelength range and in a second direction responsive to the second wavelength range.

7. The method of claim 1, wherein the first and second infrared images are captured in sequential first and second integration periods, respectively.

8. The method of claim 1, wherein:
the infrared detectors are implemented by a plurality of corresponding unit cells each comprising a sample-hold circuit and an integration circuit; and
the method further comprises storing the first infrared image by the sample-hold circuits while the second infrared image is received by the integration circuits during the capturing of the second infrared image.

9. A method comprising:
operating a plurality of infrared detectors in a dual band mode to capture infrared images alternating between a first wavelength range and a second wavelength range, wherein the operating comprises:
capturing a first infrared image corresponding to the first wavelength range,
switching the infrared detectors to respond to the second wavelength range, and
capturing a second infrared image corresponding to the second wavelength range;

determining a correlation between dual band mode fixed pattern noise (FPN) in the second infrared image associated with the switching and differences in pixel values of the first and second infrared images by:

operating the infrared detectors in a single band mode to capture a first set of sequential infrared images corresponding to the first wavelength range, operating the infrared detectors in the single band mode to capture a second set of sequential infrared images corresponding to the second wavelength range, operating the infrared detectors in the dual band mode to capture a third set of infrared images alternating between the first and second wavelength ranges, comparing the first and second sets of infrared images to the third set of infrared images to determine offsets in pixel values of the third set of infrared images in relation to the first and second sets of infrared images, determining differences in pixel values of the first and second wavelength range infrared images of the third set, and correlating the offsets in pixel values of the third set of infrared images to the differences in the pixel values of the first and second wavelength range infrared images of the third set;

calculating, using the correlation, a correction term to compensate for the dual band mode FPN in the second infrared image associated with the switching, wherein the calculating uses a correlation between the dual band mode FPN and differences in pixel values of the first and second infrared images; and applying the correction term to the second infrared image to reduce the dual band mode FPN.

10. The method of claim 9, wherein the correlation comprises a correlation between:

differences in pixel values of the first and second infrared images captured in the dual band mode, and differences in pixel values exhibited by the second infrared image in relation to a third infrared image of the second wavelength range captured by the infrared detectors in a single band mode.

11. A system comprising:

a plurality of infrared detectors configured to:

operate in a dual band mode to capture infrared images alternating between a first wavelength range and a second wavelength range, capture, in the dual band mode, a first infrared image corresponding to the first wavelength range, switch, in the dual band mode, to respond to the second wavelength range, and capture, in the dual band mode, a second infrared image corresponding to the second wavelength range; and a logic device configured to:

determine a correlation between:

differences in pixel values of the first and second infrared images captured in the dual band mode, and differences in pixel values exhibited by the second infrared image in relation to a third infrared image of the second wavelength range captured by the infrared detectors in a single band mode, calculate, using the correlation, a correction term to compensate for dual band mode fixed pattern noise (FPN) in the second infrared image associated with the switch, and apply the correction term to the second infrared image to reduce the dual band mode FPN.

12. The system of claim 11, wherein:

the infrared detectors are selectively configurable to operate in the dual band mode or a single band mode; and the infrared detectors in the single band mode are configured to capture sequential infrared images in one of the first wavelength range or the second wavelength range.

13. The system of claim 12, wherein:

the correction term is a first correction term; and the logic device is configured to apply a second correction term to the second infrared image to reduce single band mode FPN.

14. The system of claim 11, wherein the correction term is a global correction term applied to all pixels of the second infrared image.

15. The system of claim 11, wherein the correction term is one of a plurality of pixel-wise correction terms applied to corresponding pixels of the second infrared image.

16. The system of claim 11, wherein the correlation comprises a correlation between the dual band mode FPN and the differences in pixel values of the first and second infrared images.

17. The system of claim 16, wherein the logic device is configured to:

operate the infrared detectors in a single band mode to capture a first set of sequential infrared images corresponding to the first wavelength range;

operate the infrared detectors in the single band mode to capture a second set of sequential infrared images corresponding to the second wavelength range;

operate the infrared detectors in the dual band mode to capture a third set of infrared images alternating between the first and second wavelength ranges;

compare the first and second sets of infrared images to the third set of infrared images to determine offsets in pixel values of the third set of infrared images in relation to the first and second sets of infrared images;

determine differences in pixel values of the first and second wavelength range infrared images of the third set; and correlate the offsets in pixel values of the third set of infrared images to the differences in the pixel values of the first and second wavelength range infrared images of the third set.

18. The system of claim 11, wherein:

the infrared detectors are diodes comprising P-N junctions; and the diodes are selectively configurable to pass currents in a first direction responsive to the first wavelength range and in a second direction responsive to the second wavelength range.

19. The system of claim 11, wherein the first and second infrared images are captured in sequential first and second integration periods, respectively.

20. The system of claim 11, further comprising:

a plurality of unit cells each comprising at least one of the infrared detectors, a sample-hold circuit, and an integration circuit; and the sample-hold circuits are configured to store the first infrared image while the second infrared image is received by the integration circuits during the capture of the second infrared image.

\* \* \* \* \*